(12) United States Patent
Ankenapalli et al.

(10) Patent No.: US 10,133,840 B2
(45) Date of Patent: Nov. 20, 2018

(54) PRIORITY BASED CIRCUIT SYNTHESIS

(71) Applicant: International Business Machines Corporation, Armonk, NY (US)

(72) Inventors: Vijay K. Ankenapalli, Hyderabad (IN); Ayan Datta, Kolkata (IN); Sumitha George, State College, PA (US); Charudhattan Nagarajan, Bangalore (IN); James D. Warnock, Somers, NY (US)

(73) Assignee: International Business Machines Corporation, Armonk, NY (US)

( * ) Notice: Subject to any disclaimer, the term of this patent is extended or adjusted under 35 U.S.C. 154(b) by 111 days.

(21) Appl. No.: 14/958,957

(22) Filed: Dec. 4, 2015

(65) Prior Publication Data

US 2017/0161406 A1   Jun. 8, 2017

(51) Int. Cl.
*G06F 9/455* (2018.01)
*G06F 17/50* (2006.01)

(52) U.S. Cl.
CPC .................. *G06F 17/505* (2013.01)

(58) Field of Classification Search
USPC ........................................................ 716/104
See application file for complete search history.

(56) References Cited

U.S. PATENT DOCUMENTS

| 6,415,426 | B1* | 7/2002 | Chang ................. G06F 17/5072 716/113 |
| 7,496,870 | B2 | 2/2009 | Lyalin et al. |
| 8,091,057 | B1 | 1/2012 | Suthar et al. |
| 2003/0051220 | A1* | 3/2003 | Okada .................. G06F 17/505 716/134 |
| 2006/0112362 | A1* | 5/2006 | Kitano ................ G06F 17/5072 716/119 |
| 2008/0052655 | A1* | 2/2008 | Curtin ...................... B62K 3/02 716/114 |
| 2013/0111426 | A1 | 5/2013 | Durbha et al. |
| 2013/0212549 | A1* | 8/2013 | Maziasz .............. G06F 17/5077 716/119 |
| 2015/0234948 | A1* | 8/2015 | Chakrabarti ........ G06F 17/5081 716/104 |

FOREIGN PATENT DOCUMENTS

JP    2013033360 A    2/2013

OTHER PUBLICATIONS

"HDL Synthesis Coding Guidelines for Lattice Semiconductor FPGAs", Lattice Semiconductor Corporation, Oct. 2005, Technical Note TN1008, pp. 12-1-12-17.

* cited by examiner

*Primary Examiner* — Bryce Aisaka
(74) *Attorney, Agent, or Firm* — Andrew Aubert

(57) ABSTRACT

A computer-implemented method includes receiving, with one or more processors, a text-based description of a logic circuit comprising a plurality of logic sub-circuits, determining within the text-based description, with one or more processors, a set of circuit priority indicators for a corresponding set of the logic sub-circuits, and synthesizing, with one or more processors, the logic circuit according to the set of circuit priority indicators to provide a synthesized circuit description. A corresponding computer program product and computer system are also disclosed herein.

20 Claims, 4 Drawing Sheets

200A

210

ATTRIBUTE BLOCK_DATA of CRITICAL : Label is "PRIORITY_SYNTHESIS_LEVEL2"
BLOCK_CRITICAL:
cmp_addr_gen: for i in 63 downto 44 generate
    cmp_addr_ci(i) <= ((base(i) or offset(i)) and cmp_addr_ci(i+1)) or (base(i) and offset(i) );
end generate cmp_addr_gen;

200B sig1 = latch(inp1, clk1); 220  230A

*priority_synth_mark_hierarchy : abc.xyz;
sig2 = function(inp1, value2); 220  230B

*priority_synth_mark_hierarchy : normal;
out1 = latch(sig2, clk1);

PRIORITY BASED CIRCUIT SYNTHESIS

BACKGROUND OF THE INVENTION

The present invention relates generally to designing electronic circuits such as integrated circuits, and more particularly to synthesizing electronic circuits.

Modern integrated circuits often have millions of circuit elements such as gates, latches, and drivers in addition to scores of I/O pins. Rather than design such circuits on the gate level, designers often use a hardware description language (HDL) to describe the desired functionality of the circuit including timing constraints. The resulting description (e.g., in the form of HDL statements) is typically highly hierarchical in nature similar to software programs. The hierarchical HDL statements are then parsed and expanded by a synthesis program which converts the statements to circuit/logic elements such as gates and registers. The process of parsing, expanding, and conversion is known as logic synthesis.

Each of these circuit elements must then be sized, placed (e.g., in a design space corresponding to a chip), and electrically connected (routed) to other circuit elements, or to I/O pins, via wires (a.k.a. traces) to realize the desired functionality. The process of sizing, placing, and routing is known as physical synthesis.

One of the primary drivers behind conventional logical and physical synthesis is "circuit slack". Circuit slack is a time measurement that indicates how much timing delay (budget) is available before the timing constraints are exceeded for a particular portion of the circuit. A negative circuit slack indicates that the circuit delay must be reduced to meet the timing constraints. The objective with conventional automated synthesis, placement and routing is to eliminate all negative slack values.

Conventionally, eliminating negative slack values requires an iterative approach that often requires manual intervention. Furthermore, the described processes have a high number of interdependencies which make automated optimization difficult. For example, the speed of circuit elements is typically dependent on the size of the transistors. In turn, the size of the circuit elements affects how far apart they must be spaced and the signal delay.

SUMMARY

As disclosed herein a computer-implemented method includes receiving, with one or more processors, a text-based description of a logic circuit comprising a plurality of logic sub-circuits, determining within the text-based description, with one or more processors, a set of circuit priority indicators for a corresponding set of the logic sub-circuits, and synthesizing, with one or more processors, the logic circuit according to the set of circuit priority indicators to provide a synthesized circuit description. A corresponding computer program product and computer system are also disclosed herein.

DETAILED DESCRIPTION

It should be noted that references throughout this specification to features, advantages, or similar language herein do not imply that all of the features and advantages that may be realized with the embodiments disclosed herein should be, or are in, any single embodiment of the invention. Rather, language referring to the features and advantages is understood to mean that a specific feature, advantage, or characteristic described in connection with an embodiment is included in at least one embodiment of the present invention. Thus, discussion of the features, advantages, and similar language, throughout this specification may, but do not necessarily, refer to the same embodiment.

Furthermore, the described features, advantages, and characteristics of the invention may be combined in any suitable manner in one or more embodiments. One skilled in the relevant art will recognize that the invention may be practiced without one or more of the specific features or advantages of a particular embodiment. In other instances, additional features and advantages may be recognized in certain embodiments that may not be present in all embodiments of the invention.

These features and advantages will become more fully apparent from the following drawings, description and appended claims, or may be learned by the practice of the invention as set forth hereinafter.

The embodiments disclosed herein recognize that current synthesis prioritization approaches are based on circuit slack which is not initially known. Furthermore, HDL circuit descriptions are typically highly hierarchical and require the circuit synthesis program to expand hierarchical statements into a flat circuit description to determine circuit delay. Optimization tools, which optimize the circuit in order to minimize or eliminate circuit slack, have difficulty in prioritizing the paths deep in the hierarchy, within a specific number of iterations. Such an approach makes it difficult to get optimal timing closure, and is referred to herein as a "slack depth issue". Due to the slack depth issue, and similar issues, conventional logical and physical synthesis is highly iterative in nature and often requires user intervention in order to achieve the desired functionality including timing constraints.

Figure 1:
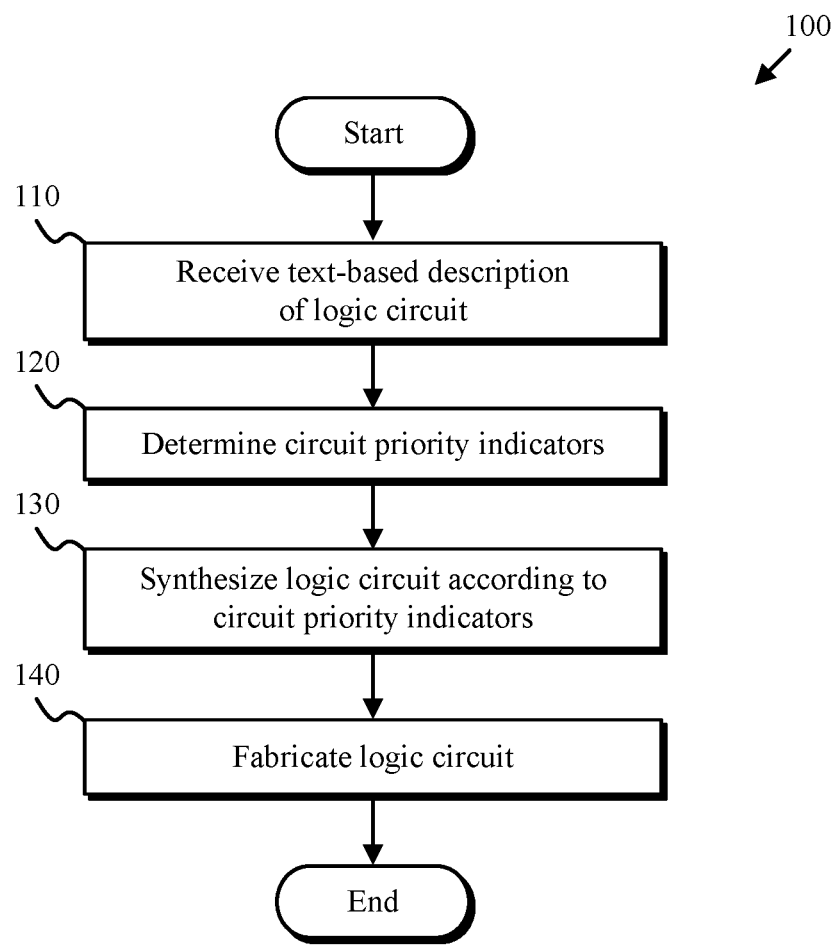
FIG. 1 is flowchart depicting one example of an automated circuit design method in accordance with at least one embodiment of the present invention.

The present invention will now be described in detail with reference to the Figures. FIG. 1 is flowchart depicting one example of an automated circuit design method 100 in accordance with at least one embodiment of the present invention. As depicted, the automated circuit design method 100 includes receiving (110) a text-based description of a logic circuit, determining (120) one or more circuit priority indicators, synthesizing (130) the logic circuit, and fabricating the logic circuit. The automated circuit design method 100 enables prioritized synthesis of a logic circuit including logical synthesis and physical synthesis.

Receiving (110) a text-based description of a logic circuit may include receiving a file comprising hardware description statements that conform to a hardware description language (HDL). The text-based description of the logic circuit may include one or more circuit priority indicators corresponding to specific portions of the logic circuit. In some embodiments, the circuit priority indicators are labels within the text-based description of the logic circuit. In certain embodiments, the circuit priority indicators are function parameters for logic functions specified within the text-based description of the logic circuit.

Determining (120) one or more circuit priority indicators may include determining the circuit priority indicators within the text-based description of the logic circuit and the portions of the logic circuit to which they apply/correspond.

Synthesizing (130) the logic circuit may include synthesizing the logic circuit according to the text-based description including the circuit priority indicators. The circuit priority indicators may control or influence the conversion of the hierarchical definitions into a gate-level design and/or a layout (device geometry) design.

The synthesizing process may include logical synthesis and/or physical synthesis. In some embodiments, the result of logical synthesis (e.g., a EDIF file) may retain the circuit priority indicators. Consequently physical synthesis (e.g., automated placement and routing) may also be conducted according to the circuit priority indicators. The result of physical synthesis may be a layout design file such as a GDSII file that specifies geometries and layers for each device (e.g., each transistor). Fabricating (140) the logic circuit may include fabricating an integrated circuit, or the like, according to the layout design file.

Figures 2A, 2B, 3:
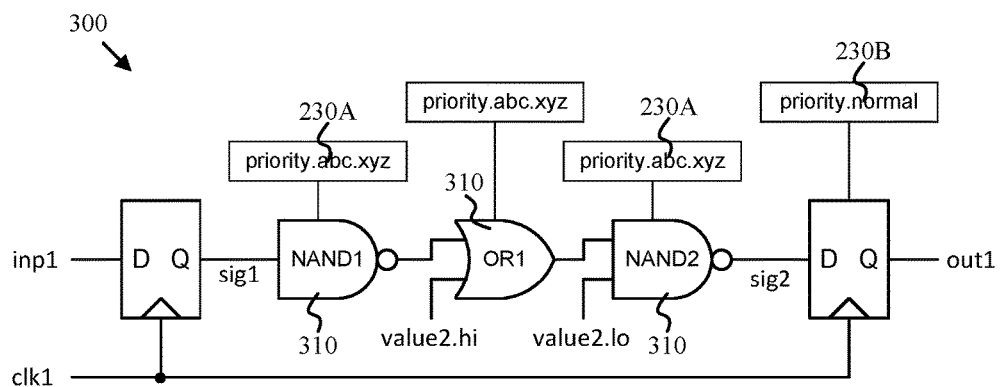
FIG. 2A is a text diagram depicting one example of a circuit priority indication approach in accordance with at least one embodiment of the present invention.
FIG. 2B is a text diagram depicting another example of a circuit priority indication approach in accordance with at least one embodiment of the present invention.
FIG. 3 is a schematic diagram of a gate-level circuit that retains circuit priority indicators.

FIG. 2A is a text diagram depicting one example of a circuit priority indication approach 200A in accordance with at least one embodiment of the present invention. As depicted, the circuit priority indication approach 200A includes a label 210 that indicates the synthesis priority for a selected portion of the logic circuit.

FIG. 2B is a text diagram depicting one example of a circuit priority indication approach 200A in accordance with at least one embodiment of the present invention. As depicted, the circuit priority indication approach 200B includes a priority indication command 220 which is used to mark a portion of the circuit within the text-based circuit description with a selected priority indicator 230.

FIG. 3 is a schematic diagram of a gate-level circuit 300 that retains the circuit priority indicators 230. The depicted gate-level circuit 300 corresponds to the example HDL statements shown in FIG. 2B. As shown, each of the logic gates 310 correspond to the statement "sig2=function(inp1, value2)" and are marked with the "abc.xyz" priority indicator 230A. In contrast the remainder of the gate-level circuit 300 is not marked or marked with a normal priority indicator 230B. The selected structure of the logic gates 310 may reflect the indicated priority without requiring, or waiting for, estimation of the circuit slack for the gate-level circuit 300 (e.g., the difference between the desired clock period and the timing delay of the logic gates 310 including any required latch setup time).

Figure 4:
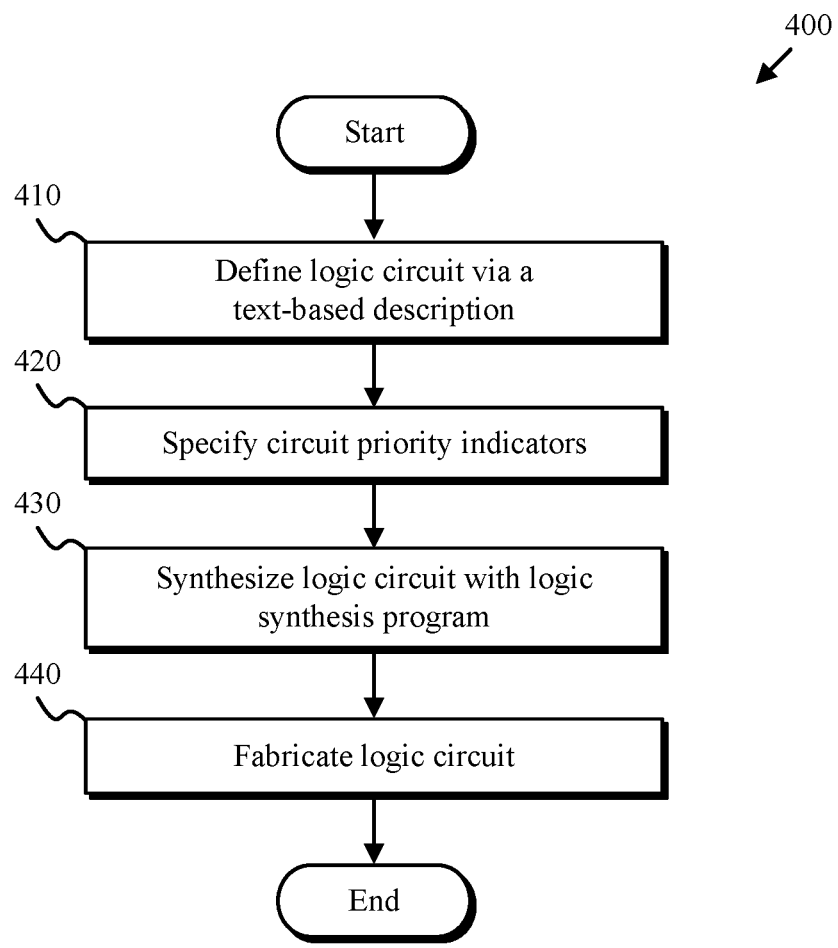
FIG. 4 is flowchart depicting one example of a circuit design method in accordance with at least one embodiment of the present invention.

FIG. 4 is flowchart depicting one example of a circuit design method 400 in accordance with at least one embodiment of the present invention. As depicted, the circuit design method 400 includes defining (410) a logic circuit, specifying (420) one or more circuit priority indicators, synthesizing (430) the logic circuit, and fabricating (440) the logic circuit. The circuit design method 400 may be conducted in conjunction with electronic design software such as logic synthesis software that supports a circuit priority indicator.

Defining (410) a logic circuit may include defining, via a text-based description such as an HDL file, the logical functionality and timing constraints for the logic circuit. Specifying (420) one or more circuit priority indicators may include specifying, within the text-based description, a circuit priority for at least a portion of the logic circuit.

Synthesizing (430) the logic circuit may include synthesizing the logic circuit according to the text-based description including the circuit priority indicators to create a synthesized circuit description. The synthesized circuit description may comprise a gate level netlist or a transistor level netlist. For example, the synthesizing process may be conducted by a logic synthesis program launched by a user. In some embodiments, the result of the logic synthesis process (e.g., an EDIF file) may retain the circuit priority indicators. Consequently physical synthesis may also be conducted according to the circuit priority indicators. The result may be a layout file such as a GDSII file. Fabricating (440) the logic circuit may include fabricating an integrated circuit or the like, according to the layout file.

The embodiments disclosed herein improve logical and physical synthesis by using circuit priority indictors that may be defined previous to synthesis and leveraged during the entire synthesis process.

Figure 5:
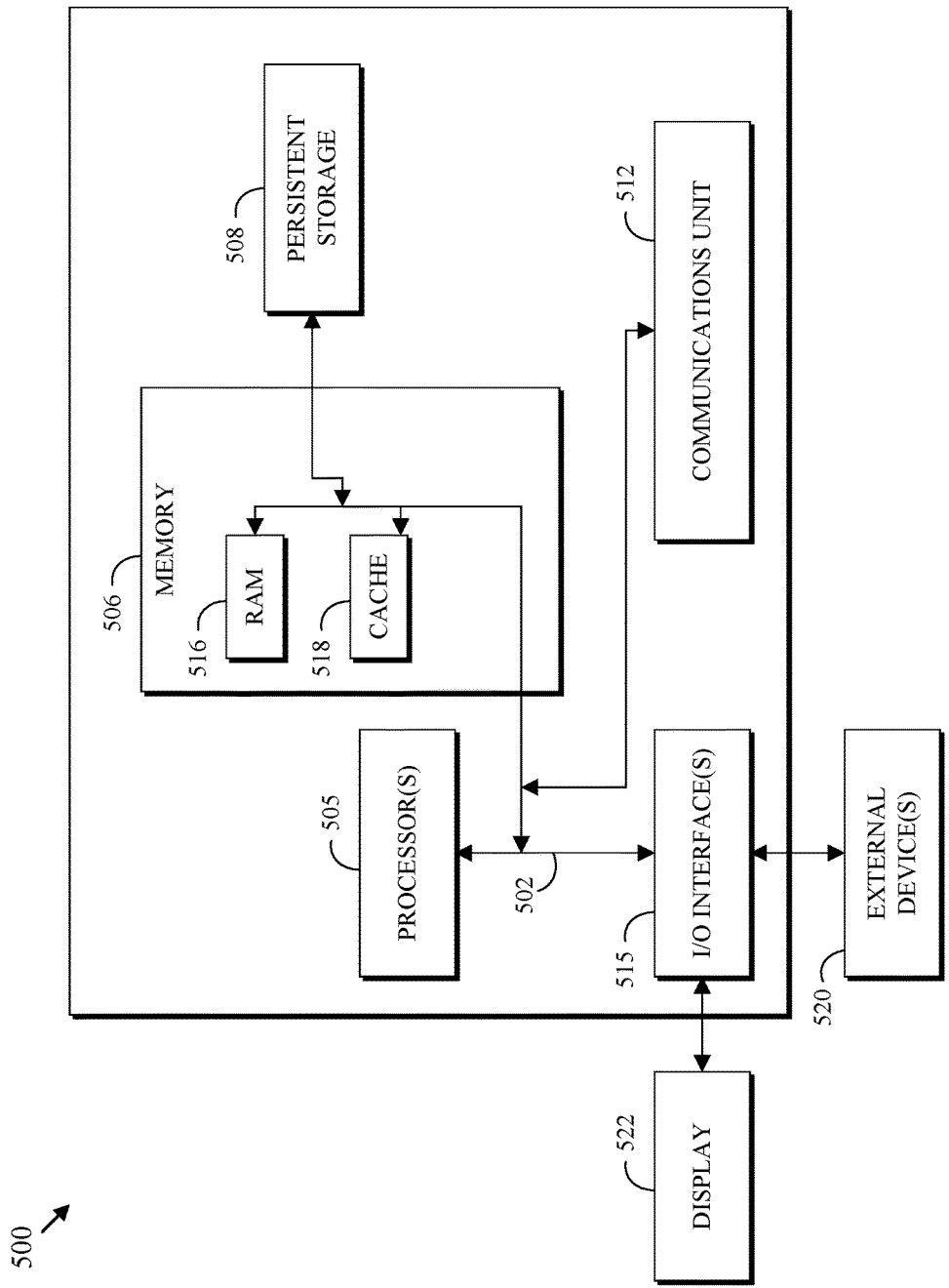
FIG. 5 is a block diagram depicting one example of a computing apparatus (i.e., computer) suitable for executing the methods disclosed herein.

FIG. 5 is a block diagram depicting one example of a computing apparatus (i.e., computer 500) suitable for executing the methods disclosed herein. It should be appreciated that FIG. 5 provides only an illustration of one embodiment and does not imply any limitations with regard to the environments in which different embodiments may be implemented. Many modifications to the depicted environment may be made.

As depicted, the computer 500 includes communications fabric 502, which provides communications between computer processor(s) 505, memory 506, persistent storage 508, communications unit 512, and input/output (I/O) interface(s) 515. Communications fabric 502 can be implemented with any architecture designed for passing data and/or control information between processors (such as microprocessors, communications and network processors, etc.), system memory, peripheral devices, and any other hardware components within a system. For example, communications fabric 502 can be implemented with one or more buses.

Memory 506 and persistent storage 508 are computer readable storage media. In the depicted embodiment, memory 506 includes random access memory (RAM) 516 and cache memory 518. In general, memory 506 can include any suitable volatile or non-volatile computer readable storage media.

One or more programs may be stored in persistent storage 508 for execution by one or more of the respective computer processors 505 via one or more memories of memory 506. The persistent storage 508 may be a magnetic hard disk drive, a solid state hard drive, a semiconductor storage device, read-only memory (ROM), erasable programmable read-only memory (EPROM), flash memory, or any other computer readable storage media that is capable of storing program instructions or digital information.

The media used by persistent storage 508 may also be removable. For example, a removable hard drive may be used for persistent storage 508. Other examples include optical and magnetic disks, thumb drives, and smart cards that are inserted into a drive for transfer onto another computer readable storage medium that is also part of persistent storage 508.

Communications unit 512, in these examples, provides for communications with other data processing systems or devices. In these examples, communications unit 512 includes one or more network interface cards. Communications unit 512 may provide communications through the use of either or both physical and wireless communications links.

I/O interface(s) 515 allows for input and output of data with other devices that may be connected to computer 500. For example, I/O interface 515 may provide a connection to external devices 520 such as a keyboard, keypad, a touch screen, and/or some other suitable input device. External devices 520 can also include portable computer readable storage media such as, for example, thumb drives, portable optical or magnetic disks, and memory cards.

Software and data used to practice embodiments of the present invention can be stored on such portable computer readable storage media and can be loaded onto persistent storage 508 via I/O interface(s) 515. I/O interface(s) 515 may also connect to a display 522. Display 522 provides a mechanism to display data to a user and may be, for example, a computer monitor.

One of skill in the art will appreciate that the above disclosed embodiments may be adapted for a variety of environments and applications. Furthermore, the programs described herein are identified based upon the application for which they are implemented in a specific embodiment of the invention. However, it should be appreciated that any particular program nomenclature herein is used merely for convenience, and thus the invention should not be limited to use solely in any specific application identified and/or implied by such nomenclature.

The embodiments disclosed herein include a system, a method, and/or a computer program product. The computer program product may include a computer readable storage medium (or media) having computer readable program instructions thereon for causing a processor to carry out the methods disclosed herein.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowcharts and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

It should be noted that this description is not intended to limit the invention. On the contrary, the embodiments presented are intended to cover some of the alternatives, modifications, and equivalents, which are included in the spirit and scope of the invention as defined by the appended claims. Further, in the detailed description of the disclosed embodiments, numerous specific details are set forth in order to provide a comprehensive understanding of the claimed invention. However, one skilled in the art would understand that various embodiments may be practiced without such specific details.

Although the features and elements of the embodiments disclosed herein are described in particular combinations, each feature or element can be used alone without the other features and elements of the embodiments or in various combinations with or without other features and elements disclosed herein.

This written description uses examples of the subject matter disclosed to enable any person skilled in the art to practice the same, including making and using any devices or systems and performing any incorporated methods. The patentable scope of the subject matter is defined by the claims, and may include other examples that occur to those skilled in the art. Such other examples are intended to be within the scope of the claims.

What is claimed is:

1. A computer-implemented method comprising:
    receiving, by one or more processor(s), a text-based description of a logic circuit comprising a plurality of logic sub-circuits, wherein the text-based description comprises hierarchical hardware description language statements that define the logic circuit and the plurality of logic sub-circuits;
    determining within the text-based description, by the one or more processor(s), a set of circuit priority indicators that are explicitly indicated within the text-based description, for a corresponding set of the logic sub-circuits;
    synthesizing, by the one or more processor(s), the logic circuit according to the set of circuit priority indicators to provide a synthesized circuit description without requiring, or waiting for, estimation of a circuit slack for any of the plurality of logic sub-circuits; and
    fabricating the logic circuit using the synthesized circuit description wherein a circuit priority indicator is a function parameter.

2. The method of claim 1, wherein the synthesized circuit description retains the circuit priority indicators.

3. The method of claim 2, further comprising:
    placing the logic circuit, by the one or more processor(s), according to the set of circuit priority indicators; and
    routing, by the one or more processor(s), the logic circuit according to the set of circuit priority indicators.

4. The method of claim 1, wherein synthesizing includes logical synthesis.

5. The method of claim 1, wherein synthesizing includes physical synthesis.

6. The method of claim 1, wherein a circuit priority indicator is a label or function parameter.

7. The method of claim 1, wherein the synthesized circuit description comprises a gate level netlist or a transistor level netlist.

8. A computer program product comprising:
    one or more computer readable storage media;
    program instructions stored on the one or more computer readable storage media, the program instructions comprising instructions for causing one or more processor(s) to perform the following operations:
    receiving, by the one or more processor(s), a text-based description of a logic circuit comprising a plurality of logic sub-circuits, wherein the text-based description comprises hierarchical hardware description language statements that define the logic circuit and the plurality of logic sub-circuits,
    determining within the text-based description, by the one or more processor(s), a set of circuit priority indicators that are explicitly indicated within the text-based description, for a corresponding set of the logic sub-circuits,
    synthesizing, by the one or more processor(s), the logic circuit according to the set of circuit priority indicators to provide a synthesized circuit description without requiring, or waiting for, estimation of a circuit slack for any of the plurality of logic sub-circuits; and
    fabricating the logic circuit using the synthesized circuit description wherein a circuit priority indicator is a function parameter.

9. The computer program product of claim 8, wherein the synthesized circuit description retains the circuit priority indicators.

10. The computer program product of claim 9, wherein the program instructions include further instructions for causing the one or more computer processor(s) to perform the following operations:
    placing the logic circuit according to the set of circuit priority indicators; and
    routing the logic circuit according to the set of circuit priority indicators.

11. The computer program product of claim 8, wherein synthesizing includes logical synthesis.

12. The computer program product of claim 8, wherein synthesizing includes physical synthesis.

13. The computer program product of claim 8, wherein a circuit priority indicator is a label.

14. The computer program product of claim 8, wherein a circuit priority indicator is a function parameter.

15. The computer program product of claim 8, wherein the synthesized circuit description comprises a gate level netlist or a transistor level netlist.

16. A computer system comprising:
one or more processor(s);
one or more computer readable storage media;
program instructions stored on the one or more computer readable storage media for execution by at least one of one or more processor(s), the program instructions comprising instructions for causing the one or more processor(s) to perform operations including the following:
receiving, by the one or more processor(s), a text-based description of a logic circuit comprising a plurality of logic sub-circuits, wherein the text-based description comprises hierarchical hardware description language statements that define the logic circuit and the plurality of logic sub-circuits,
determining within the text-based description, by the one or more processor(s), a set of circuit priority indicators that are explicitly indicated within the text-based description, for a corresponding set of the logic sub-circuits,
synthesizing, by the one or more processor(s), the logic circuit according to the set of circuit priority indicators to provide a synthesized circuit description without requiring, or waiting for, estimation of a circuit slack for any of the plurality of logic sub-circuits, and
fabricating the logic circuit using the synthesized circuit description wherein a circuit priority indicator is a function parameter.

17. The computer system of claim 16, wherein the synthesized circuit description retains the circuit priority indicators.

18. The computer system of claim 17, wherein the program instructions further include instructions for causing the one or more computer processor(s) to perform the following operations:
placing the logic circuit according to the set of circuit priority indicators; and
routing the logic circuit according to the set of circuit priority indicators.

19. The computer system of claim 18, wherein synthesizing includes logical synthesis or physical synthesis.

20. The computer system of claim 16, wherein the synthesized circuit description comprises a gate level netlist or a transistor level netlist.

* * * * *